US012765158B2

(12) United States Patent
Chung et al.

(10) Patent No.: US 12,765,158 B2
(45) Date of Patent: Oct. 13, 2026

(54) PROCESS FOR THE HALOGEN TREATMENT OF METAL OXIDE LAYERS

(71) Applicants: HUAWEI TECHNOLOGIES CANADA CO., LTD., Kanata (CA); Dong Seob Chung, Waterloo (CA); Hany Maher Aziz, Waterloo (CA)

(72) Inventors: Dong Seob Chung, Waterloo (CA); Hany Maher Aziz, Oakville (CA)

(73) Assignees: HUAWEI TECHNOLOGIES CANADA CO., LTD., Kanata (CA); Dong Seob Chung, Waterloo (CA); Hany Maher Aziz, Waterloo (CA)

( * ) Notice: Subject to any disclaimer, the term of this patent is extended or adjusted under 35 U.S.C. 154(b) by 965 days.

(21) Appl. No.: 17/707,465

(22) Filed: Mar. 29, 2022

(65) Prior Publication Data

US 2023/0320115 A1 Oct. 5, 2023

(51) Int. Cl.

*H10K 50/115* (2023.01)
*H10K 71/00* (2023.01)
*H10K 71/30* (2023.01)

(52) U.S. Cl.

CPC ........... *H10K 50/115* (2023.02); *H10K 71/00* (2023.02); *H10K 71/30* (2023.02)

(58) Field of Classification Search

CPC ...... H10K 50/115; H10K 71/00; H10K 71/30; H10K 2102/331; H10K 50/165

See application file for complete search history.

(56) References Cited

U.S. PATENT DOCUMENTS

| | | | | |
|---|---|---|---|---|
| 6,107,116 | A | 8/2000 | Kariya et al. | |
| 8,197,914 | B2 | 6/2012 | Garg et al. | |
| 9,466,488 | B2 | 10/2016 | Lin et al. | |
| 2017/0186909 | A1* | 6/2017 | Kim ...................... | H10K 50/18 |
| 2017/0207327 | A1 | 7/2017 | Hsu et al. | |
| 2021/0126218 | A1* | 4/2021 | Kim ...................... | H10K 50/15 |

FOREIGN PATENT DOCUMENTS

| | | | |
|---|---|---|---|
| CN | 107369766 | A | 11/2017 |

OTHER PUBLICATIONS

Ye et al., "Enhanced Operation in Charge-Trapping Nonvolatile Memory Device With Si3N4 / Al2O3 / HfO2 Charge Trapping Layer", IEEE Electron Device Letters, vol. 33, No. 10, Oct. 2012, 33.

Choi et al., "A Simple Approach to the Fabrication of Fluorine-doped Zinc Oxide Thin Films by Atomic Layer Deposition at Low Temperatures and an Investigation into the Growth Mode", Journal of Materials Chemistry C, 2014, 2, 98-108.

(Continued)

*Primary Examiner* — Thanh T Nguyen

(57) ABSTRACT

This invention is related to a new treatment process employed during preparation of the ZnO ETL in a QDLED. The treatment involves exposing the ZnO layer to fluorine (F). In embodiments of this invention, the exposure of the ZnO layer to the F is performed using a fluorine plasma environment (e.g., using $CF_4$, $CHF_3$, $C_4F_8$ or $SF_6$). Alternatively, the F exposure may be done by exposing the ZnO ETL to a suitable fluorine-containing substance such as fluorine gas or fluorinated solvents. The F plasma treatment of the ZnO improves both QDLED device EQE and EL stability.

15 Claims, 16 Drawing Sheets

(56) References Cited

OTHER PUBLICATIONS

Polydorou et al., "Surface Passivation Effect by Fluorine Plasma Treatment on ZnO for Efficiency and Lifetime Improvement of Inverted Polymer Solar Cells", Journal of Materials Chemistry A, 2016, 4, 11844-11858.
Xu et al., "Passivation Effect on ZnO Films by SF6 Plasma Treatment", Crystals, 2019, 9, 236-245.
Han, W. et al., "ZnO Nanocrystal Thin Films for Quantum-Dot Light-Emitting Devices" ACS Applied Nano Materials, 2020, 3 (8), 7535-7542.

* cited by examiner

PROCESS FOR THE HALOGEN TREATMENT OF METAL OXIDE LAYERS

TECHNICAL FIELD

The present invention pertains to the field of electroluminescent devices, and in particular to processes for making improved materials for use in manufacturing such devices.

BACKGROUND

Quantum-dot light emitting devices (QDLEDs) utilize colloidal quantum dots as an electroluminescent (EL) medium for emitting light under the effect of electrical bias. In comparison to other light emitting device technologies, such as OLEDs and inorganic LEDS, QDLEDs provide narrower EL spectra and therefore better color quality. QDLEDs are therefore currently being developed for utilization in flat panel displays to replace OLEDs. QDLEDs however still have a relatively short EL half-life, which limits their use in commercial flat panel display products (e.g. TV, laptop and mobile phone screens, etc.).

In a QDLED, the QD material is used in the form of a thin film interposed between two electrodes for injecting electrons and holes under electrical bias. In addition to the QD layer and the two electrodes, the device typically also comprises electron and hole transport layers (ETL and HTL), located in-between the QD layer and the electron injecting electrode (cathode), and the QD layer the hole injecting electrode (anode), respectively, for the purpose of facilitating the charge injection and improving device EL efficiency and performance. In these devices, a ZnO nanoparticle layer is commonly used as ETL, and therefore is interposed between the cathode and the QD layer. The device layers are coated sequentially on a substrate for support, starting with either the anode or the cathode, and ending with the cathode or anode.

Ever since a first hybrid-type quantum-dot light emitting device (QDLED),[1] utilizing combination of inorganic-organic charge transport layers, has been reported to overcome drawbacks of small molecular electron transport layer (ETL), zinc oxide (ZnO) has been receiving enormous attention for use in QD luminescent material.[2-5] With its superior characteristics, e.g. optical, electrical, and chemical properties, the external quantum efficiency (EQE) of QDLED reaches above 30%,[6] quickly approaching demand of commercial products. ZnO is a II-VI inorganic material with a wurtzite crystal structure that has a wide direct band gap of 3.37 eV.[7] In order to exploit its favourable properties, high quality ZnO synthesis and deposition processes are required. There have been many reports for the purposes: hydrothermal synthesis,[8] sol-gel derivation,[9] thermal sublimation,[10] etc. ZnO nanoparticle (NP) synthesized by various techniques provides a good crystal structure with simple and fast process with cost-effective solution-processability.

Although ZnO is widely utilized in QDLEDs and other LEDs owing to its superior electrical and optical properties, intrinsic limitations and defects in ZnO cause many problems, such as carrier accumulation, exciton dissociation, Auger recombination. These eventually contribute to device efficiency and stability deterioration which hampers the realization of high performance devices and commercialization.

In the multi-layered QDLED structure, the QD and charge transport layer heterojunction interface is crucial for achieving high device performance because it is directly involved in many physical phenomena for efficient photon emission, such as carrier injection, exciton formation and dissociation. In terms of basic energy band theory, it is estimated that well-matched conduction band minimum (CBM) of ZnO and QD facilitates efficient electron injection into QD emission layer (QD EML) to form excitons, by interaction with holes supplied by hole transport layers (HTL). However, it is impossible to accurately estimate and optimize optoelectronic phenomena at the interface by considering simple band offset as long as there are sub-bandgap states originated from stoichiometric and structural defects in ZnO.[7, 11-12] Moreover, asymmetric charge injection and transport in ETL versus HTL is also known to hinder a successful design of the superior QDLED. The lack of accurate understanding and estimation on interfacial engineering remains arguable issues on device performance improvement.[13-17]

In this regard, many attempts have been made to resolve and mitigate the negative effects from the ZnO/QD interface. For example, polymer layer insertion into ZnO ETL/QD EML interface has handled adverse effects at ZnO/QD interface.[17-20] ZnO and polymer blended ETL[15, 21] has been introduced as another utilization of polymer materials to overcome interfacial issues.

A few methods have been suggested to mitigate the negative effects of the ZnO mentioned above on device performance. Introduction of various dopants, for example, metallic dopants such as magnesium, aluminum, germanium, etc, has been demonstrated to modify structural and electrical properties of ZnO.[22-28] Such chemical doping, however, has been observed to lead to reliability issues. In addition, doping with metals likely perturbs electron transport which can cause considerable conductivity losses. For example, although using magnesium-doped ZnO in ETL leads to highly efficient QDLED, the chemical instability of the resulting material has been observed to bring about an unusual aging effect[26-27] which is an obstacle to designing highly stable device.

Fluorine is another dopant considered to be applicable for ZnO modification.[28-29] The ionic radius of fluorine is comparable to that of oxygen, which allows neutralization of oxygen vacancies without massive lattice distortion.[30-32] Additionally, the strong electronegativity of fluorine may result in distinctive electronics properties. Based on diverse doping techniques, fluorine-modified ZnO has been applied to various device structures. It was reported that fluorine-doped ZnO improves electrical performance in many thin film transistor structures.[32-33] the passivation effect of fluorine atoms on oxygen vacancies is also widely used in high performance photovoltaic devices.[30-1, 34-35]

Notably, however, a fluorine-doped ZnO functional layer has not yet been reported for use in QDLEDs.

SUMMARY

An object of the present invention is to provide a process for the halogen treatment of a metal oxide layer. In accordance with an aspect of the present invention, there is provided a process for preparing a halogen-doped metal oxide material comprising the step of exposing a metal oxide layer to a halogen source, wherein the halogen source is selected from a halogen-containing plasma, a halogenated solvent and a halogen gas, and wherein the metal oxide layer is an electron transport layer (ETL) deposited during manufacture of a light emitting device (LED). In one embodiment, the halogen source is a fluorine-containing plasma.

In accordance with another aspect of the present invention, there is provided a light emitting device comprising an electron transport layer (ETL), wherein the ETL comprises a halogen-doped metal oxide formed using the process.

In accordance with another aspect of the present invention, there is provided a use of a halogen source to convert a metal oxide layer to a halogen-doped metal oxide, wherein the halogen-doped metal oxide forms an electron transport layer (ETL) of a light emitting device (LED).

DETAILED DESCRIPTION

This invention is related to a new treatment process to be employed during preparation of the ETL of a QDLED. The treatment process of the present invention results in improved QDLED external quantum efficiency (EQE) and EL stability (the time it takes for the EL intensity to decrease to 50% of its initial value when a device is driven under a constant current).

The treatment process of the present invention is particularly suitable for preparing a halogen-doped metal oxide material comprising the step of exposing a metal oxide layer to a halogen source.

In one embodiment, the processes are used to prepare a halogen-doped material, wherein the halogen is selected from fluorine, bromine, iodine, chlorine, or a combination thereof. In a preferred embodiment, the halogen is fluorine (F).

In embodiments of the present invention, the step of exposing the metal oxide layer to a halogen source involves exposure to a halogen source selected from a halogen-containing plasma, a halogenated solvent, or a halogen gas. In a preferred embodiment, the halogen source is a halogen-containing plasma. In a further preferred embodiment, the halogen-containing plasma is a fluorine-containing plasma.

In one embodiment, the metal oxide layer is an electron transport layer (ETL) deposited during manufacture of a light emitting device (LED).

In embodiments of the present invention, the metal oxide layer comprises a metal oxide selected from ZnO, TiOx, SnOx, MgO, indium tin oxide (ITO), or a combination thereof. In a preferred embodiment, the metal oxide is ZnO. In a further preferred embodiment, the ETL is formed from nanoparticulate ZnO.

In one embodiment, the treatment process involves exposing a ZnO ETL to fluorine (F). In embodiments of this invention, the exposure of the ZnO layer to the F is performed using a fluorine plasma environment. In one embodiment, fluorine plasma is produced by a discharge of any fluorine-containing gas sources, such as $CF_4$, $CHF_3$, $C_4F_8$, $SF_6$. In one embodiment, the fluorine plasma treatment duration ranges from about 10 seconds to about 120 seconds.

In another embodiment, the fluorine exposure step is carried out by exposing the ZnO ETL to a suitable fluorine-containing substance such as fluorine gas or fluorinated solvents.

Unlike the prior art chemical doping processes, which lead to reliability and conductivity issues, the use of fluorine treatments, including fluorine plasmas, to treat a metal oxide ETL in accordance with the present invention has been observed to significantly improve device efficiency and stability without sacrificing conductivity. Since fluorine plasmas are commonly available in industrial device fabrication facilities, the processes of the present invention can be readily applied without complex modification of the state-of-the art fabrication processes.

Figure 1B:
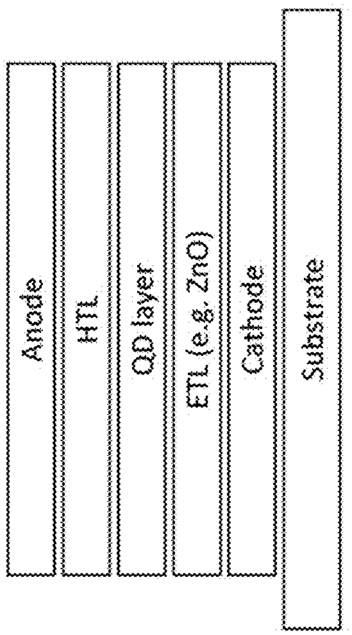
FIGS. 1A and 1B are schematic representations of two general QDLED configurations.
Figure 1A:
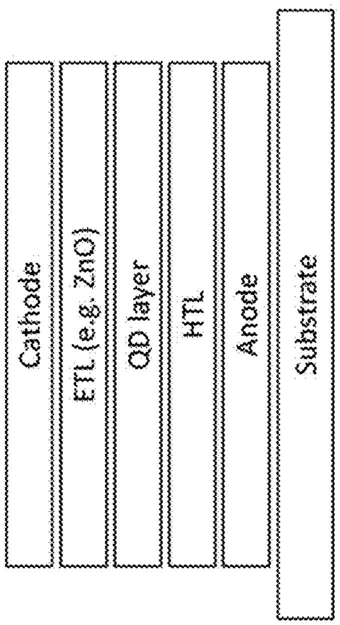

FIGS. 1A and 1B are schematic representations of two general QDLED configurations which include a metal oxide electron transfer layer (ETL) which is subjected to the fluorine treatment step of the present invention.

In embodiments of the invention, it is preferred if the F treatment is carried out after the ETL has been deposited on the substrate but before the quantum dot (QD) layer has been deposited on the substrate. In other embodiments, it is preferred if the F treatment is done in a device stack configuration in which the electrode closer to the substrate is the cathode (i.e., the configuration illustrated in FIG. 1A). In this embodiment, the F treatment is carried out after the ETL has been deposited but before coating the QD layer and subsequent layers above it. It should however be understood that the F treatment may also be beneficial in other device configurations such as that in FIG. 1B. In such an embodiment, the treatment is carried out after depositing the ETL but before the cathode layer has been applied.

In embodiments where the exposure of the ZnO to F is carried out in a plasma environment, the exposure step is preferably carried out in a low kinetic energy plasma environment in order to minimize any detrimental effects to the ZnO and/or underlying layers from collisions by high kinetic energy plasma species.

Figure 2:
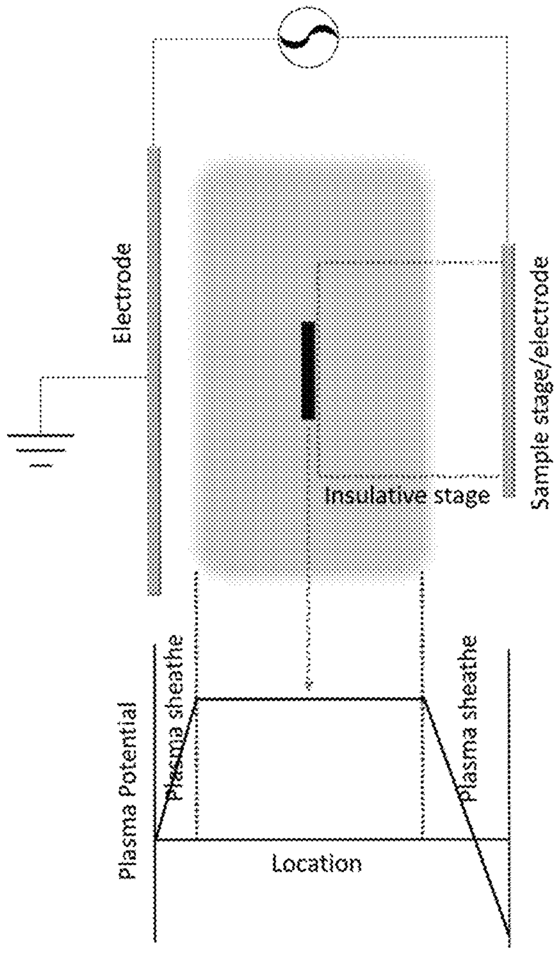
FIG. 2 is a schematic representation of a mid-chamber configuration employed for low-kinetic energy plasma doping, in accordance with one embodiment of the present invention.

In one embodiment, the low kinetic energy plasma environment is achieved by placing the substrate in a mid-chamber plasma treatment configuration, wherein the substrate is placed further away from the electrodes than in a conventional parallel-plate reactive-ion etching (RIE) plasma reactor configuration. FIG. 2 shows a schematic diagram of a mid-chamber plasma treatment configuration, as an example of a low kinetic plasma treatment configuration. This configuration is different from the conventional parallel-plate RIE plasma reactor. Using the mid-chamber configuration, the device substrate (with the layer to be treated) is placed in the middle of the plasma chamber, on an insulative stand. Unlike near the electrodes as in the conventional configuration, where voltage gradients in the plasma environment are large, the middle of the chamber has much smaller voltage gradients and therefore acceleration of plasma ionic species and their collisions with the ZnO surface are minimized.

In an alternative embodiment, the low kinetic energy plasma environment is achieved by using an ICP (inductively-coupled plasma) reactor.

In general, the F treatment process of the present invention can be used with ZnO layers fabricated using any suitable deposition process including dry processes, e.g., thermal evaporation, atomic layer deposition (ALD) or sputtering, and wet processes, e.g., spin-coating, inkjet printing, slot coating, blade coating, dip coating, using sol-gel or ZnO nanoparticles (NP) in a solvent. In a preferred embodiment, the ZnO is formed using wet processes, especially for those embodiments wherein the ETL comprises ZnO nanoparticles.

Figure 3:
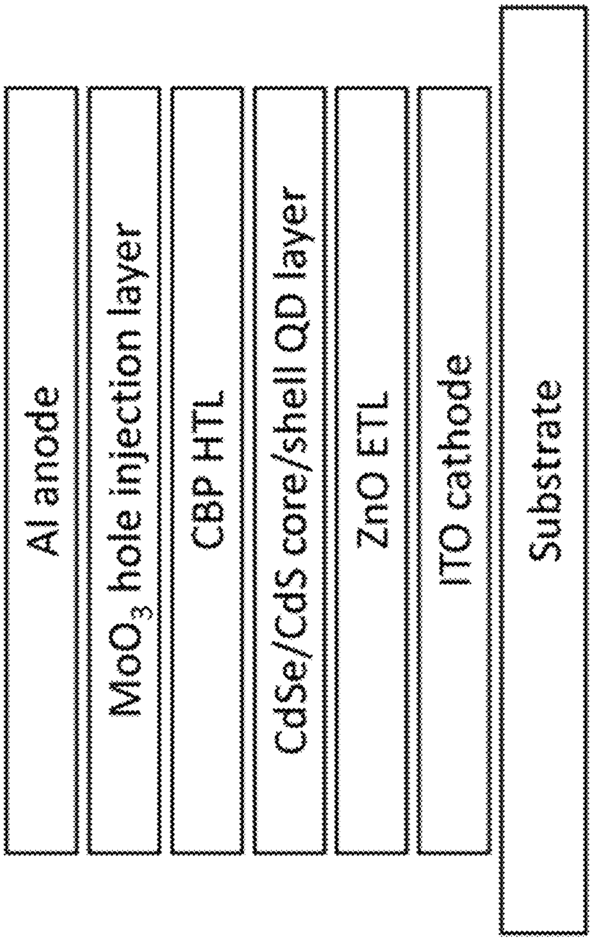
FIG. 3 is a schematic representation of a QDLED device, prepared in accordance with one embodiment of the present invention.

In one embodiment, the treatment process of the present is employed in the manufacture of a red-emitting QDLED of the structure: Substrate/Al cathode/ZnO ETL/(CdSe/CdS core/shell red emitting colloidal quantum dots)/CBP/$MoO_3$/Al. In this exemplary structure, the ITO, ZnO, CdSe/CDS, CBP, $MoO_3$ and Al served as cathode, ETL, QD layer, HTL, hole injection layer, and anode, respectively, coated sequentially on the glass substrate. The exemplary device configuration is illustrated in FIG. 3.

Without intending to be bound by theory, it is believed that the observed improvement in performance may be related to 1) passivation of ZnO surface defects and 2) modifying the ZnO energy levels and as a result attaining more favorable electron injection and transport properties. Other mechanisms may also be involved. Therefore, without intending to be limited to one specific mechanism, it can be expected that treatment processes of the present invention will be beneficial for the treatment of other ETLs, including those made of other metal oxides (e.g., TiOx, SnOx, MgO, or ITO). It may also be useful for treating non-metal oxide ETLs such as those based on metals, other metal compounds such as LiF, or $CsCO_3$, or organic ETLs.

Additionally, while the embodiments of this invention were reduced to practice (and their success verified) in QDLEDs, it can be expected that the processes of the present invention will be beneficial for treatment of ETLs of other light emitting devices such as in OLEDs, polymeric LEDs, perovskite LEDs and inorganic LEDs, particularly those utilizing metal oxides in their ETLs and more particularly ZnO.

Therefore, the embodiments of this invention can be utilized in any LED comprising the following components: (i) a substrate; (ii) a first electrode, (iii) a ZnO layer, (iv) a light emitting layer, (v) a second electrode; wherein at least one of the electrodes comprises a metal (e.g., Al, Ag, Au, Mg, In, Cr). In one embodiment, the ZnO layer deposition process may be carried out using sputtering, atomic layer deposition, or solution-coating of ZnO nanoparticles (NP) synthesized via variety of methods, e.g., sol-gel, hydrothermal, pyrolysis, chemical vapor condensation, or microemulsion.

Examples of light emitting layers employed as component (iv) may include small molecule organic compounds, polymer-based organic compounds, core/shell quantum dots, such as CdSe/CdS, CdSe/ZnS, InP/ZnS, or perovskites. When negative bias applied to the first electrode and positive bias to the second electrode, electrons are injected to a light emitting layer through a ZnO layer treated by fluorine plasma via low kinetic energy plasma configurations whereas holes are injected from the second electrode. Excitons are generated in a light emitting layer through the injection process. Photons are coming out from a light emitting layer through radiative recombination process of the excitons.

In an exemplary embodiment, carbon tetrafluoride ($CF_4$) plasma is employed for structural modification of ZnO NP. The resulting embodiment was investigated to determine the effect on inverted QDLED characteristics. With fluorine-doped ZnO, a device efficiency enhancement by 15% and significant device stability improvement by 47 times longer lifetime was observed. The investigation for cause of the device performance improvement showed the ZnO ETL modification using fluorine plasma process of the present invention changes carrier distribution throughout the QDLED structure, altering a recombination zone and recombination rate in the QD EML. This observation suggests evidence that interactions among electrons and holes at QD/HTL interfaces may play a determinative role for high performance QDLED.

The treatment processes of the present invention provide a new approach for modifying the properties of zinc oxide nanoparticles to provide highly efficient and stable quantum dot light emitting devices. Doping with carbon tetrafluoride species via low-kinetic energy plasma configuration changes chemical composition of ZnO NP film. The effect of fluorine-doping into the ZnO electron transport layer (ETL) on inverted quantum-dot light emitting devices (QDLED) performance was investigated, and QDLED lifetime increases significantly more than 47 times longer by using fluorine-plasma doped ZnO as a ETL with modest efficiency improvement. An investigation with specially-designed device architecture reveals that the improvement stems from charge distribution alteration by electron injection property of ETL. The interaction of carriers at the QD/hole transport layer (HTL) interface results in a reduction of charges accumulation and ultimately increases device stability and efficiency. The present finding provides evidence of managing charge distribution at QD/HTL interface for realizing highly stable QDLED and new approaches to achieve it.

The processes of the present invention relate to a new treatment process employed in the preparation of the ZnO ETL, which leads to an improvement in QDLED external quantum efficiency (EQE) and EL stability (the time it takes for the EL intensity to decrease to 50% of its initial value when a device is driven under a constant current). The treatment involves exposing the ZnO layer to fluorine (F). In embodiments of this invention, the exposure of the ZnO layer to the F is performed using a fluorine plasma environment (e.g., using $CF_4$, $CHF_3$, $C_4F_8$ or $SF_6$). Alternatively, the F exposure may be done by exposing the ZnO ETL to a suitable fluorine-containing substance such as fluorine gas or fluorinated solvents. The F plasma of the ZnO improves both QLED device EQE and EL stability.

The processes of the present invention provide a fluorine treatment of the oxide layer (electron transport layer) during the fabrication process of a QDLED device, to achieve improved device performance and stability, thereby providing access to QDLED devices suitable for use in the next generation of display screens in consumer products.

The invention will now be described with reference to specific examples. It will be understood that the following examples are intended to describe embodiments of the invention and are not intended to limit the invention in any way

EXAMPLES

Example 1: Manufacture and Testing of Devices Comprising Fluorine-Doped ZnO

Three devices of the configuration depicted in FIG. 3 were fabricated. In a first device, the ZnO was treated using F plasma treatment using a mid-chamber plasma reactor treatment. The plasma treatment was conducted for 60 seconds on the ZnO layer (on the ITO and glass substrates) but before coating the CdSe/CdS QD layer or any of the subsequent layer according to embodiments of this invention. In a second device, the plasma treatment was conducted for 60 seconds using a conventional (RIE) plasma configuration. In a third device, the ZnO was not treated by F plasma (and referred to below as Neat ZnO NP). Therefore, the second and third devices were not made according to the embodiments of this invention and were fabricated only to be used as control devices.

Figure 12:
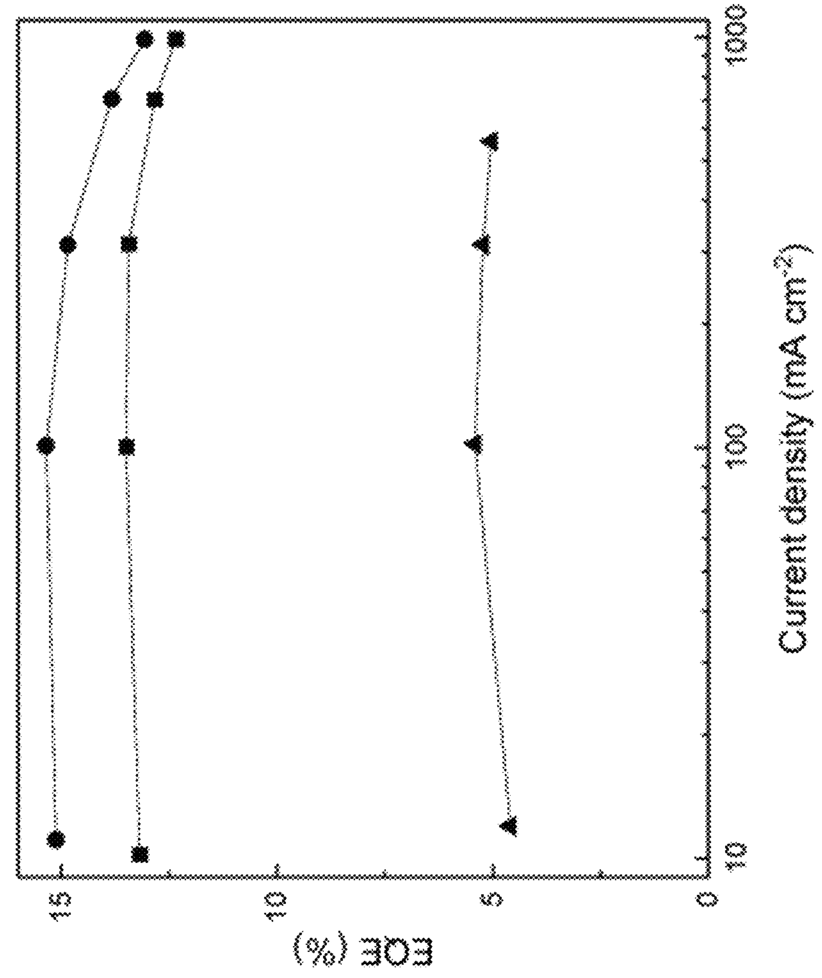
FIG. 12 is a graph of the EQE results of QDLEDs incorporating neat ZnO NP, fluorine plasma treated ZnO NP using a mid-chamber configuration, and fluorine plasma treated ZnO NP using a reactive-ion etching (RIE) configuration, respectively.

FIG. 12 shows the EQE comparison of LEDs including neat ZnO NP (squares), ZnO NP with fluorine plasma treatment via a mid-chamber plasma configuration (circles), and ZnO NP with fluorine plasma treatment via a RIE configuration (triangles). The devices according to this embodiment include CdSe/ZnS quantum dots as a light emitting layer. The plasma treatments for the devices according to this embodiment were performed for 60 seconds. The device with fluorine treated ZnO NP via a mid-chamber configuration improves EQE compared to the device with neat ZnO whereas the device with fluorine treated ZnO NP via a RIE configuration has lower value.

Figure 13:
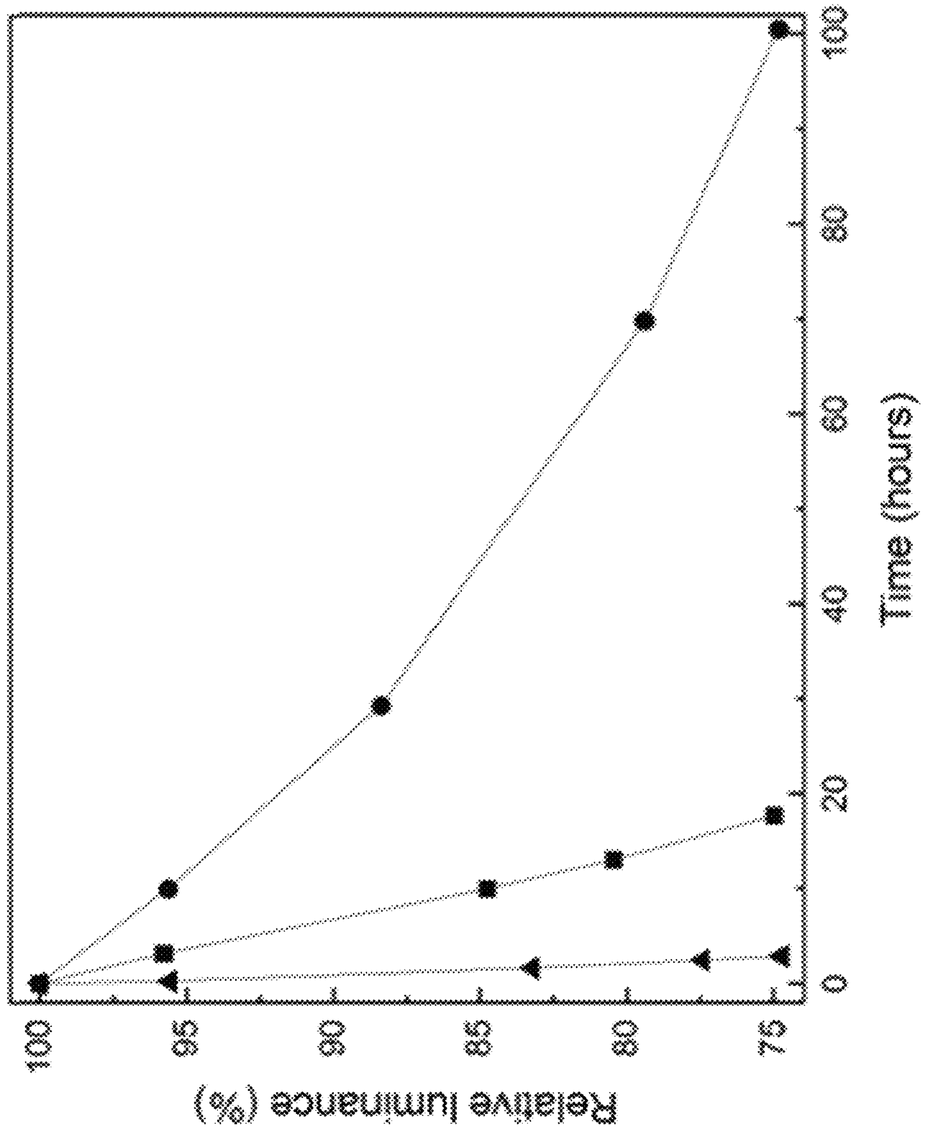
FIG. 13 is a graph of the EL stability curves of QDLEDs incorporating neat ZnO NP, fluorine plasma treated ZnO NP using a mid-chamber configuration, and fluorine plasma treated ZnO NP using a reactive-ion etching (RIE) configuration.

FIG. 13 shows the EL stability curves of QDLEDs including neat ZnO NP (squares) and fluorine plasma treated ZnO NP via either a mid-chamber configuration (circles) or a RIE configuration (triangles) in the device structures. The devices were electrically aged under constant current at 20 $mA/cm^2$. Hence the initial EL values under constant current at 20 $mA/cm^2$ of each device ranged between 3320 $cd/m^2$ for the neat ZnO NP, 3910 $cd/m^2$ for fluorine plasma treated ZnO NP via a mid-chamber configuration, and 1340 $cd/m^2$ for fluorine plasma treated ZnO NP via a RIE configuration. The result indicates that plasma treatment on ZnO NP via a mid-chamber configuration substantially slows down the rate of deterioration in device EL and thereby increases device half-life by 5 times (i.e. 500% improvement).

The results in FIGS. 12 and 13 show that the F plasma of the ZnO improves both device EQE and EL stability. They also show that using a low kinetic energy F plasma treatment (E.g. using a mid-chamber approach) enhances the benefits of the F plasma treatment to device EQE and EL stability.

From these results it is clear that, unlike chemical doping which leads to reliability and conductivity issues as mentioned above, the use of fluorine treatments including fluorine plasmas can significantly improve device efficiency and stability without sacrificing conductivity.

Chemical component modification in the ZnO NP layer are verified by a plasma-doping process. X-ray Photoelectron Spectroscopy (XPS) and Time of Flight Secondary Ion Mass Spectroscopy (TOF-SIMS) analysis of the treated ZnO layers shows a clear F trace in them, indicating that the treatment process of the present invention leaves a chemical trace that can be detected through chemical analysis techniques.

Figure 4:
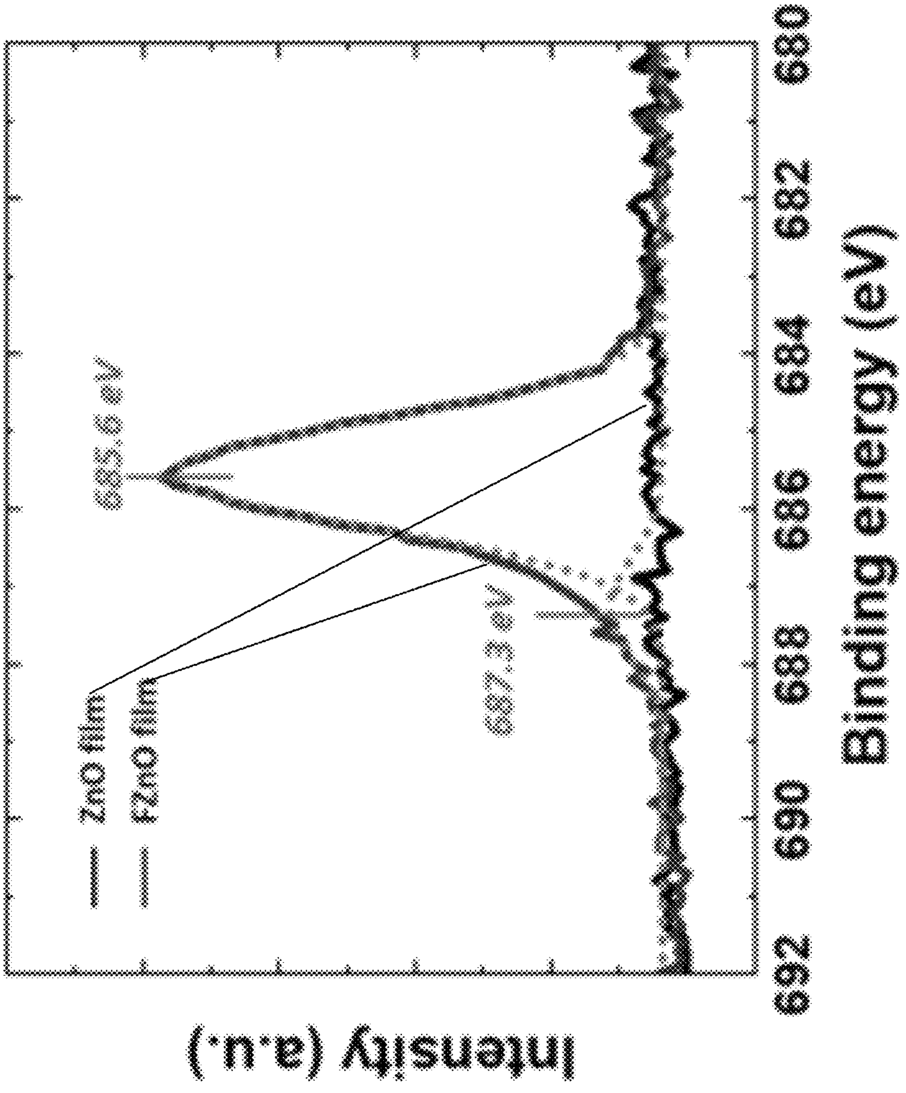
FIG. 4 is a graph overlaying the XPS F 1s peaks of a FZnO film, prepared in accordance with one embodiment of the present invention, and an undoped ZnO film.
Figure 5:
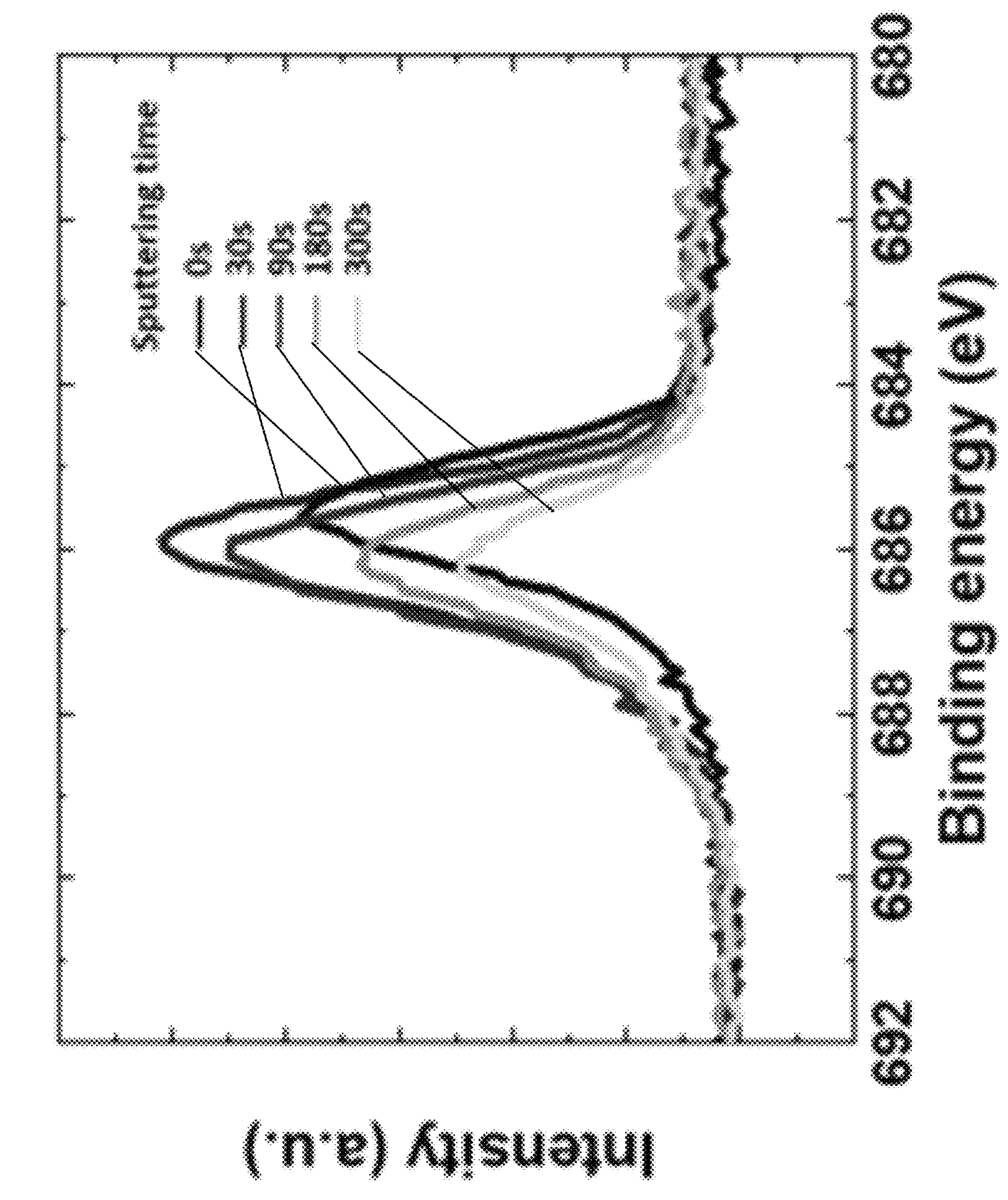
FIG. 5 is a graph of the XPS F 1s peak depth profile of a FZnO film, prepared in accordance with one embodiment of the present invention.
Figure 6:
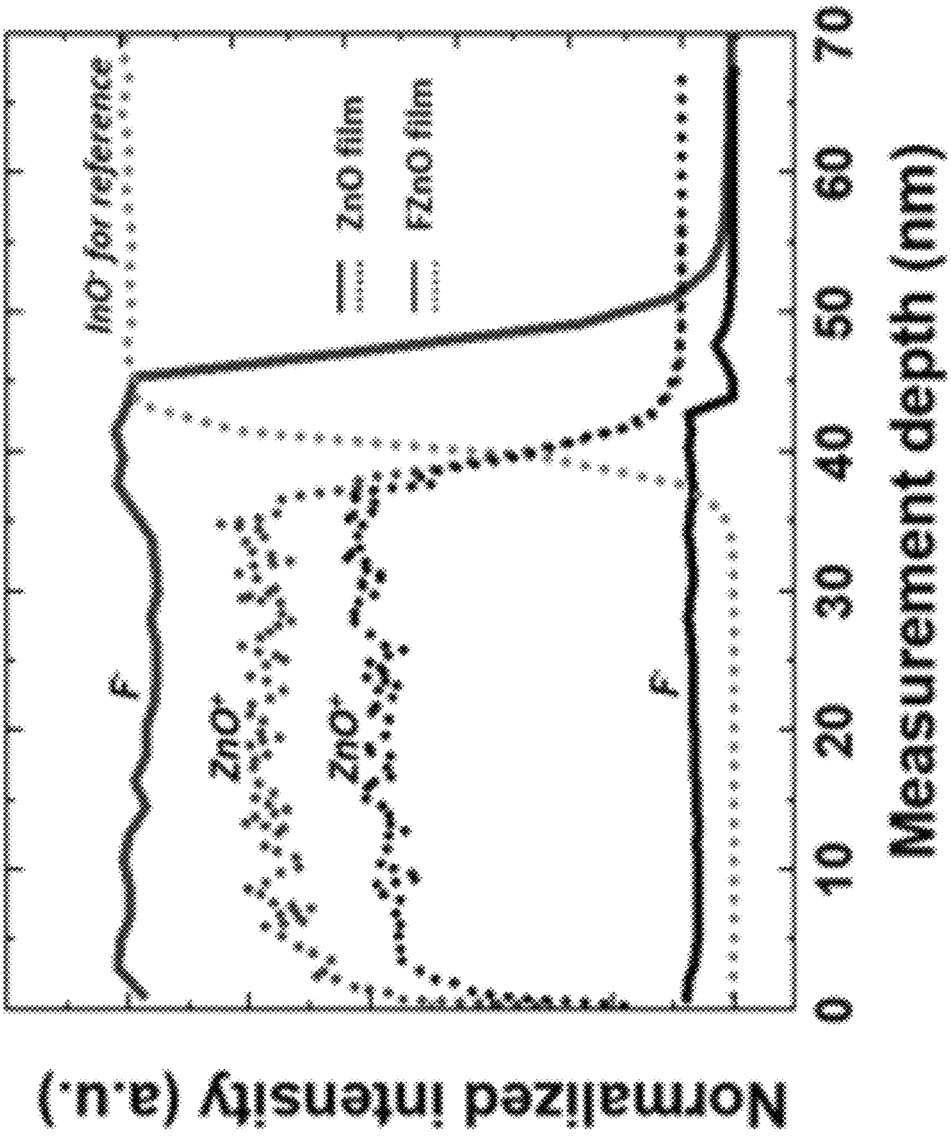
FIG. 6 is a graph of the TOF-SIMS depth profiles for $F^-$ and $ZnO^+$ of a FZnO film prepared in accordance with one embodiment of the present invention, and an undoped ZnO film. All intensity values of TOF-SIMS are normalized by intensity of $InO^-$ signal.

FIG. 4 describes the X-ray photoemission spectroscopy (XPS) result of F 1s core level spectra of fluorine-doped ZnO NP (FZnO) layer and FIG. 5 shows the depth profile of the F 1s spectral peaks in FZnO. Fluorine and ZnO ion depth profiles in neat ZnO and FZnO layer are scoped by time-of-flight secondary ion mass spectroscopy (TOF-SIMS), as shown in FIG. 6. All intensity values of TOF-SIMS are normalized by intensity of $InO^-$ signal.

Figure 7:
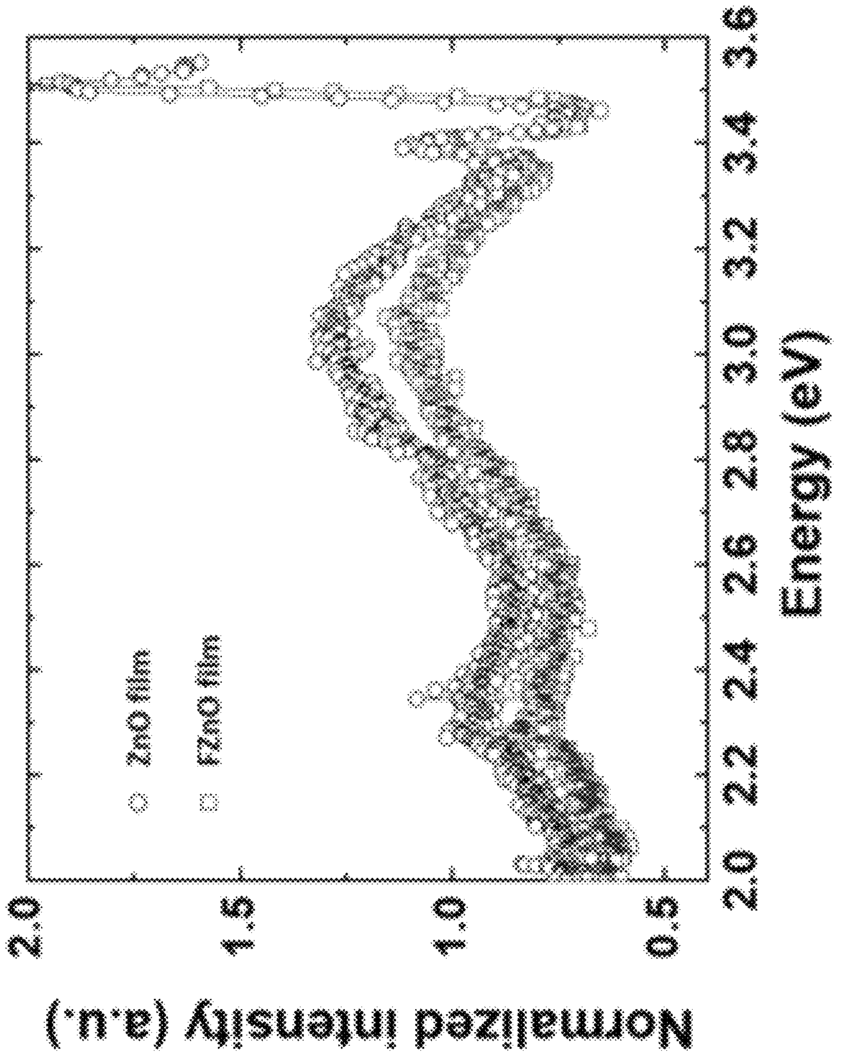
FIG. 7 is a graph of the steady-state PL spectra under 330 nm UV excitation of a FZnO film prepared in accordance with one embodiment of the present invention, and an undoped ZnO film.

Steady-state photoluminescence (PL) spectra under 330 nm excitation on neat ZnO and FZnO films are shown in FIG. 7. Conventional RIE plasma generation, widely-used in microfabrication processes, contains charged-species that are accelerated by potential gradient near the electrodes (near a sample stage) that physically weaken structural bonds in a target material to facilitate etching efficiency.[36] This high kinetic energy process is required to be mitigated for a purpose of doping of ZnO NP film. In order to reduce physical damage and realize mild-plasma treatment, ZnO is placed at the middle of the plasma chamber where there is low potential gradient as schematically described in FIG. 2, expected to have a minimal ion bombardment effect. With the low-kinetic energy $CF_4$ plasma doping, distinguishable F 1s spectrum emerges in FZnO film as can be shown in FIG. 4. Emerged F 1s spectral peak could be deconvoluted into two peaks, 685.6 eV and 687.3 eV. Peak at 685.6 eV may indicate bonding between zinc and fluorine atom whereas 687.3 eV peak may be attributed to fluorine elements in the film structure.[29-31] Notably, FIG. 5 shows that fluorine-related peaks are detected inside the NP film. The deep modification is also repeatedly observed by TOF-SIMS in FIG. 6. All the intensity of detectable species in FIG. 6 is normalized by the intensity of Indium oxide negative ion. Negative fluorine ion species is detectable throughout ZnO layer. The PL spectrum of each film is shown in FIG. 7, PL spectrum of both films has two distinguishable signals at 2.3 eV and 3.1 eV. These PL peaks indicate emission from Schockley-Read-Hall recombination at sub-band gap states and exciton recombination near the band edge, respectively.[37-39] Comparing absolute PL intensity, it was noticed that FZnO exhibits reduction of PL signal intensity, which appears to support the effective fluorine-dopant diffusion throughout ZnO film structure using the low-kinetic plasma configuration.

Figure 8:
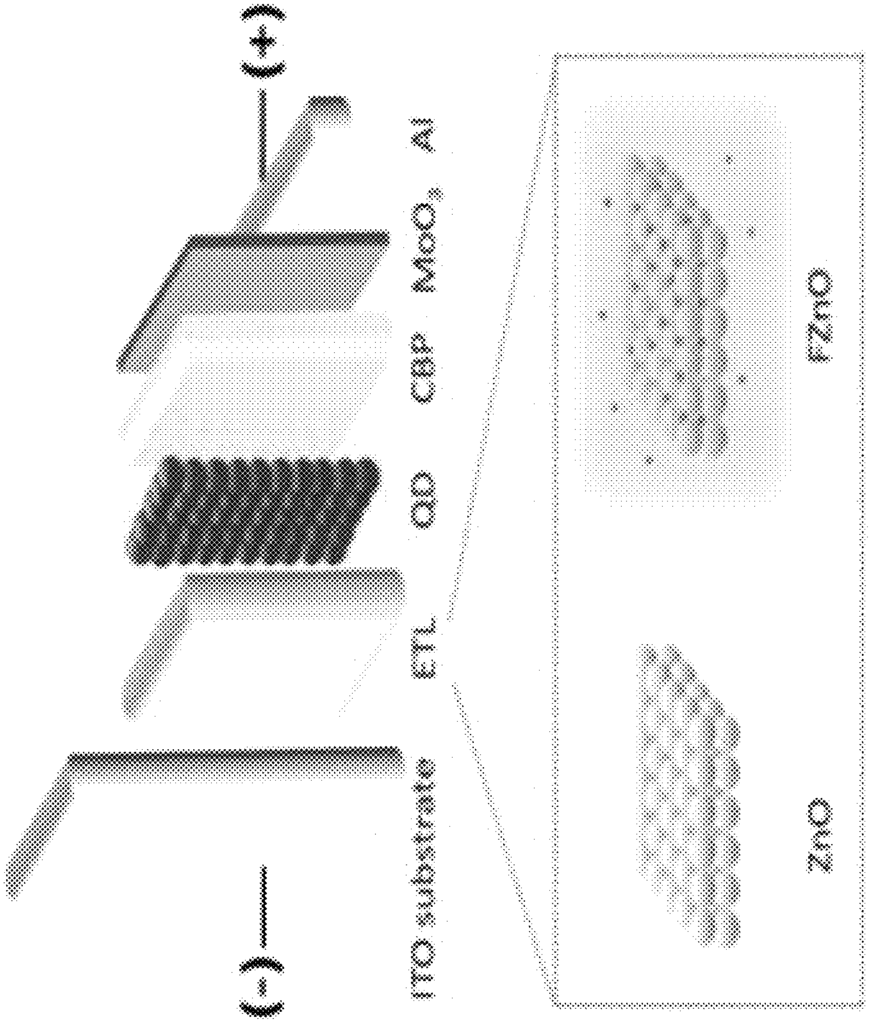
FIG. 8 is a schematic representation of the components of a QDLED employed in this experiment.

The QDLED structure in this experiment is schematically shown in FIG. 8, and comprises ITO/ETL/QD emission layer (QD EML)/CBP/$MoO_3$/Al. Two QDLEDs having the same configuration but comprising different ETLs were manufactured. The first comparative QDLED comprised neat ZnO ETL (control device, ZnO-QDLED) and the second QDLED comprised fluorine-doped ZnO NP (FZnO) ETL (FZnO-QDLED).

Figure 9:
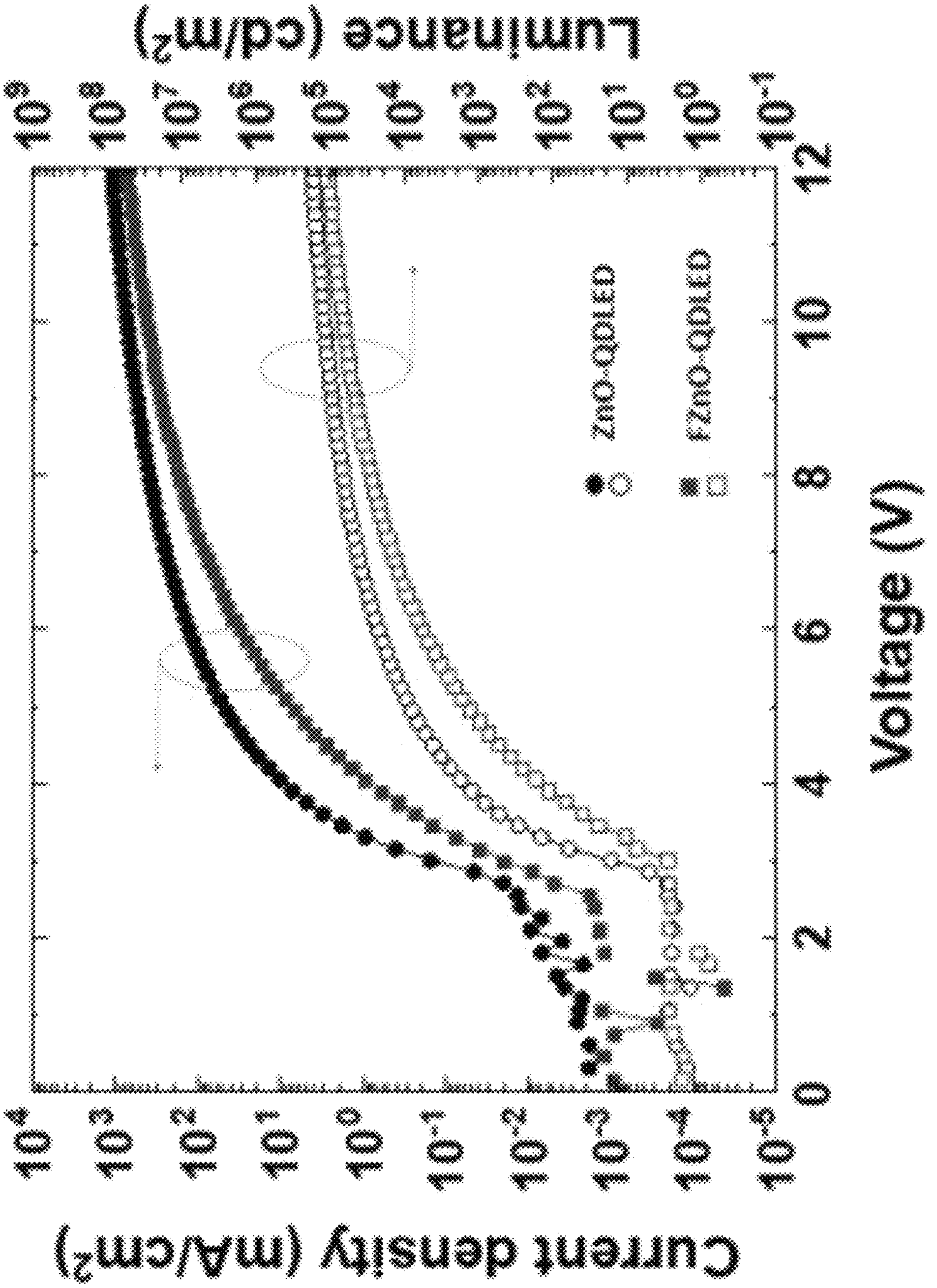
FIG. 9 is a graph of the JVL characteristics of a QDLED incorporating a FZnO ETL prepared in accordance with one embodiment of the present invention, and a QDLED incorporating an undoped ZnO film
Figure 10:
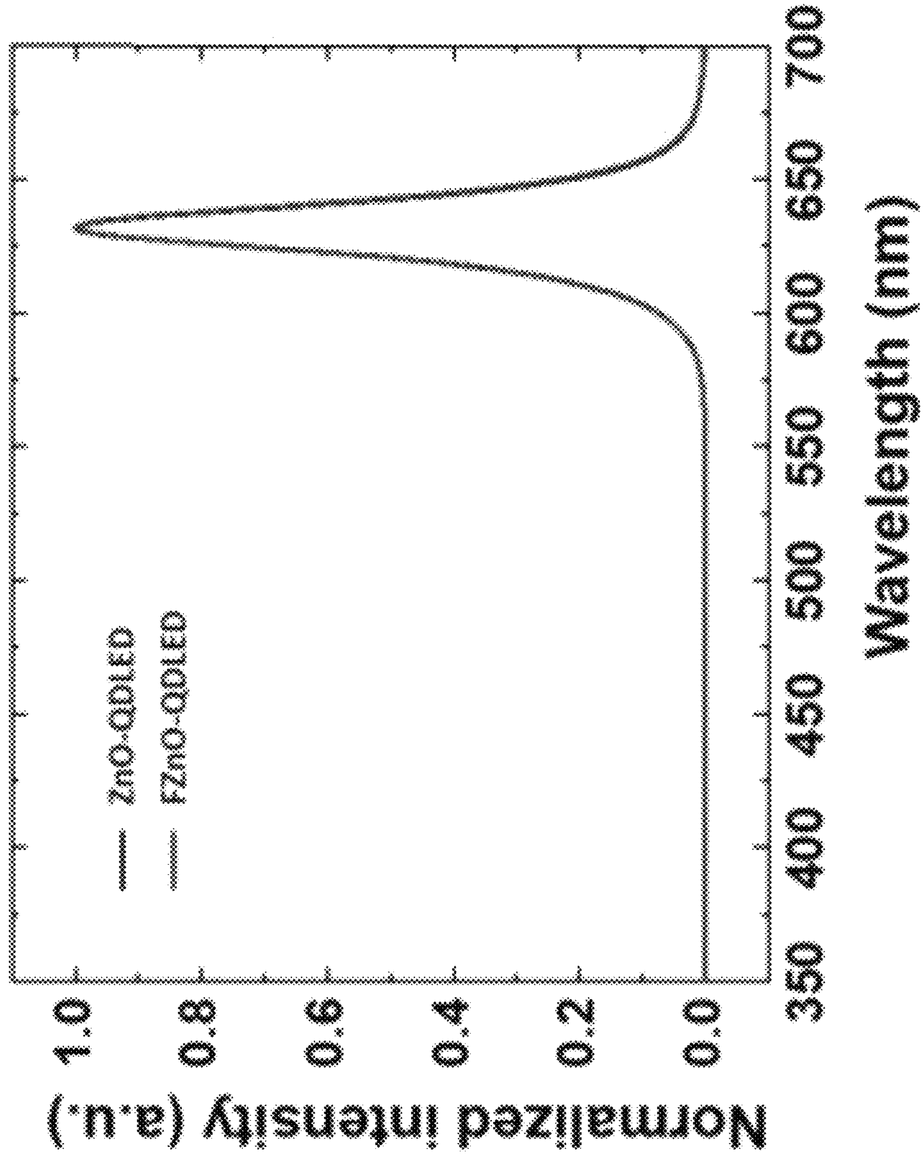
FIG. 10 is a graph of the electroluminescence spectra of QDLEDs incorporating a FZnO ETL prepared in accordance with one embodiment of the present invention, and a QDLED incorporating an undoped ZnO film
Figure 11:
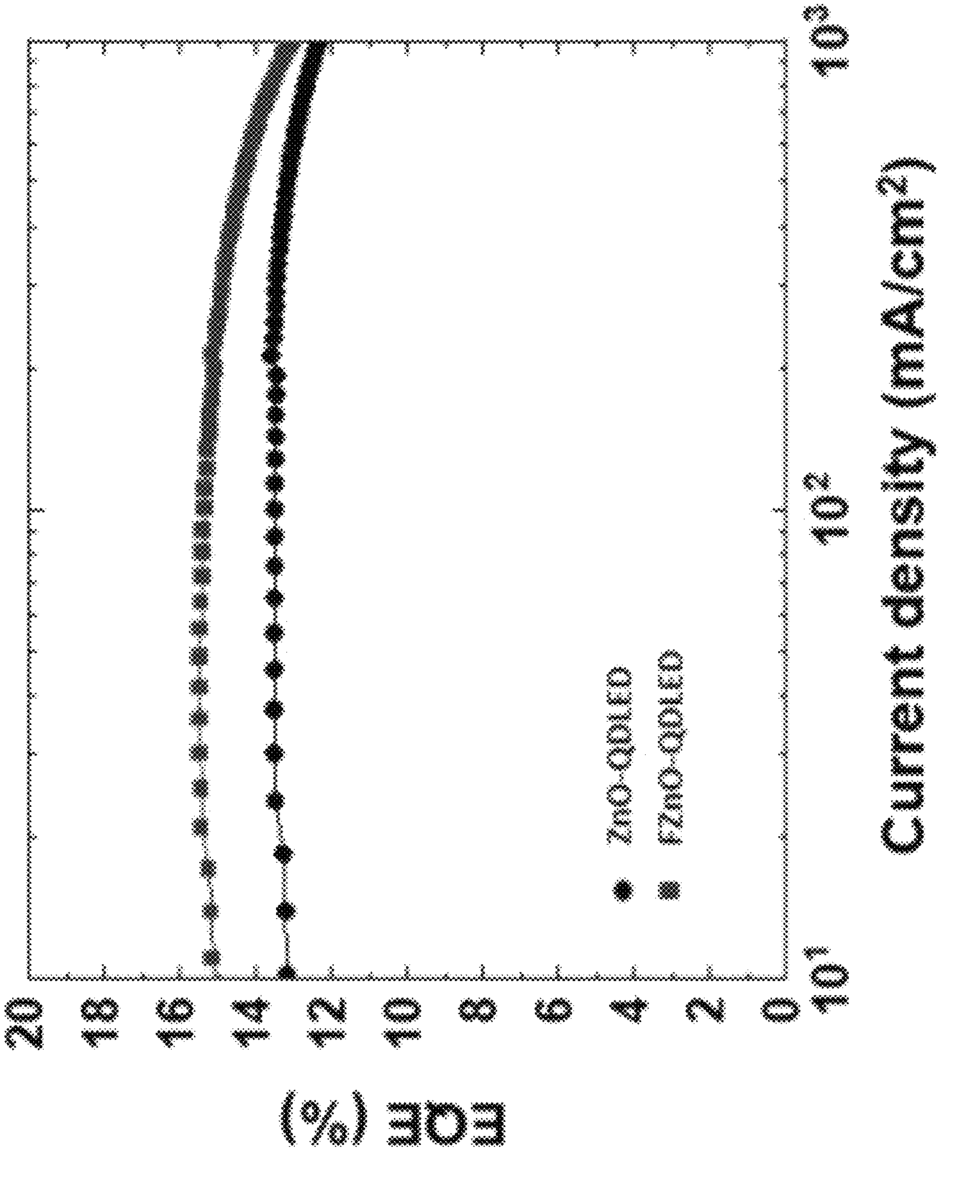
FIG. 11 is a graph of the EQE of QDLEDs incorporating a FZnO ETL prepared in accordance with one embodiment of the present invention, and a QDLED incorporating an undoped ZnO film.

The effect of FZnO ETL on electroluminescent (EL) characteristics were investigated. The EL characteristics of the QDLEDs having the configuration shown in FIG. 8 are shown in FIGS. 9-11 as follows: the current density-voltage-luminance (J-V-L) characteristics are shown in FIG. 9, the EL spectrum is shown in FIG. 10, and the EQE is shown in FIG. 11. In the J-V-L characteristics shown in FIG. 9, the fluorine doping in ZnO NP hardly changes the energy barrier between the ETL/QD interface as the FZnO-QDLED has almost identical threshold voltage ($V_{th}$) with the control device. It is noteworthy that FZnO seems to maintain an advantage of nearly-barrierless electron injection from ZnO ETL. On the other hand, current density at any given voltage becomes lower in the case of using FZnO as the ETL. This may indicate electron transport could be slowed down by the effect of fluorine-dopants in ZnO ETL. Another noticeable point is current density below $V_{th}$ is reduced in FZnO-QDLED. The phenomenon can be considered by taking into account the current flow mechanism under low-electric field condition in the junction-based diode structure. One dominant current flow mode in this condition is recombination current described by,[40-41]

$$J_{rec} = \frac{q \cdot n_i \cdot t_{scr}}{\tau_r}$$

$$\frac{1}{\tau_r} = \frac{1}{\tau_{band\ to\ band}} + \frac{1}{\tau_{SRH}}$$

$$\tau_{SRH} = \frac{1}{\alpha_{SRH} \cdot N_t}$$

where $J_{rec}$ is recombination current density and q, $n_i$, $t_{scr}$, and $\tau_r$ are the elementary charge, intrinsic carrier density in the material, thickness of space charge region at a junction, and recombination rate, respectively. Recombination in the structure, $\tau_r$, consists of band-to-band recombination ($\tau_{band\ to\ band}$) and Schockley-Read-Hall (SRH) recombination ($\tau_{SRH}$) with $\alpha_{SRH}$ and $N_t$ being SRH recombination coefficient and trap density of states. Considering the relationship of variables, SRH recombination enhanced by a number of trap states in ZnO strongly affect recombination current density. On the other hand, fluorine-dopants may fill up the states throughout the layer reducing the portion of SRH recombination in the FZnO structure. Despite of electron transport and injection, light emission under turn-on voltage ($V_{on}$) is negligible and both QDLEDs have almost same $V_{on}$. This implies there still maintain effective carrier injection at FZnO/QD for exciton formation in QD EML. The EL spectra are shown in FIG. 10. Both QDLEDs tested have strong emission at 630 nm from QD EML without discernable parasitic emission anywhere. FZnO-QDLED exhibits improvement of EQE compared to that of control device as can be shown in FIG. 11. It can be expected that FZnO enhances radiative recombination in QD EML.

Figure 14:
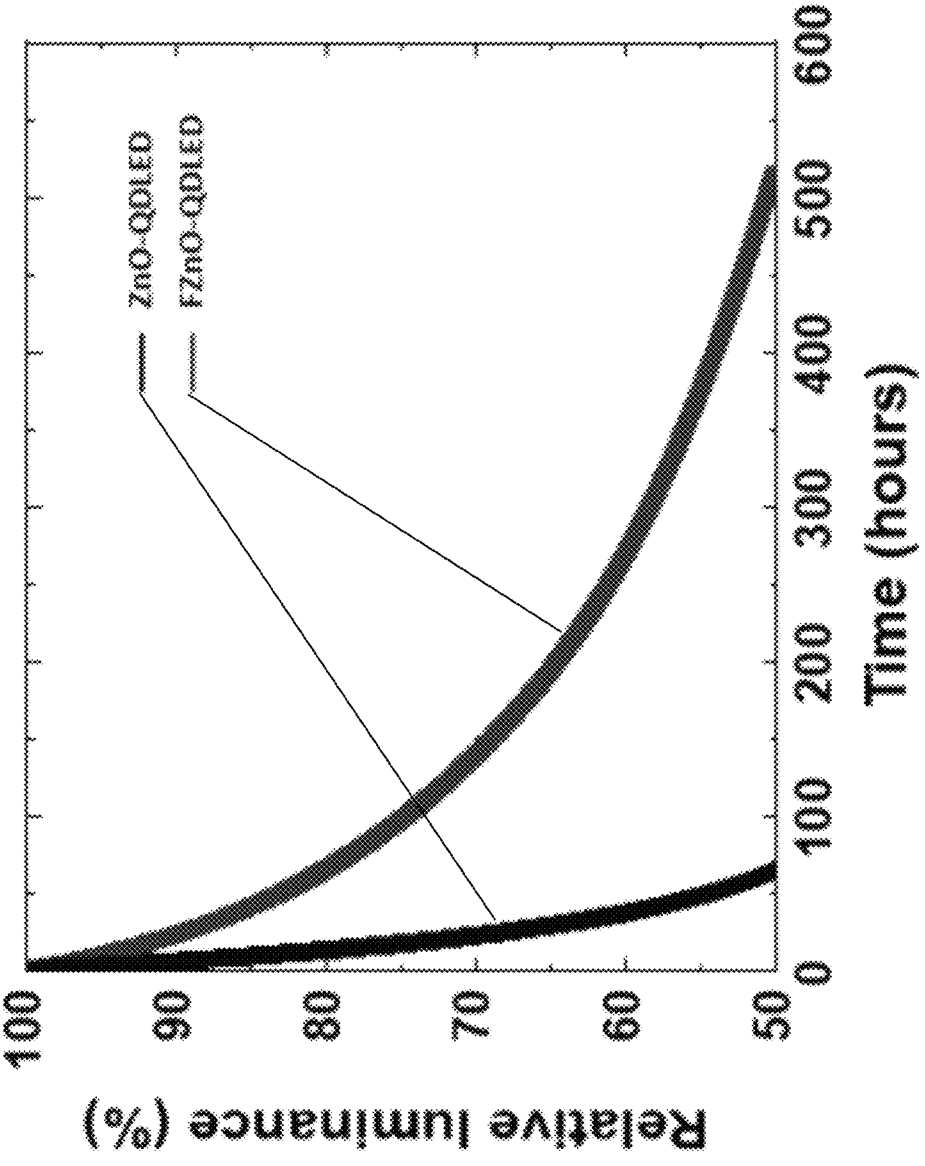
FIG. 14 is a graph of the luminance decay vs. hours of a QDLED incorporating a FZnO film prepared in accordance with one embodiment of the present invention, and a QDLED incorporating an undoped ZnO film.
Figure 15:
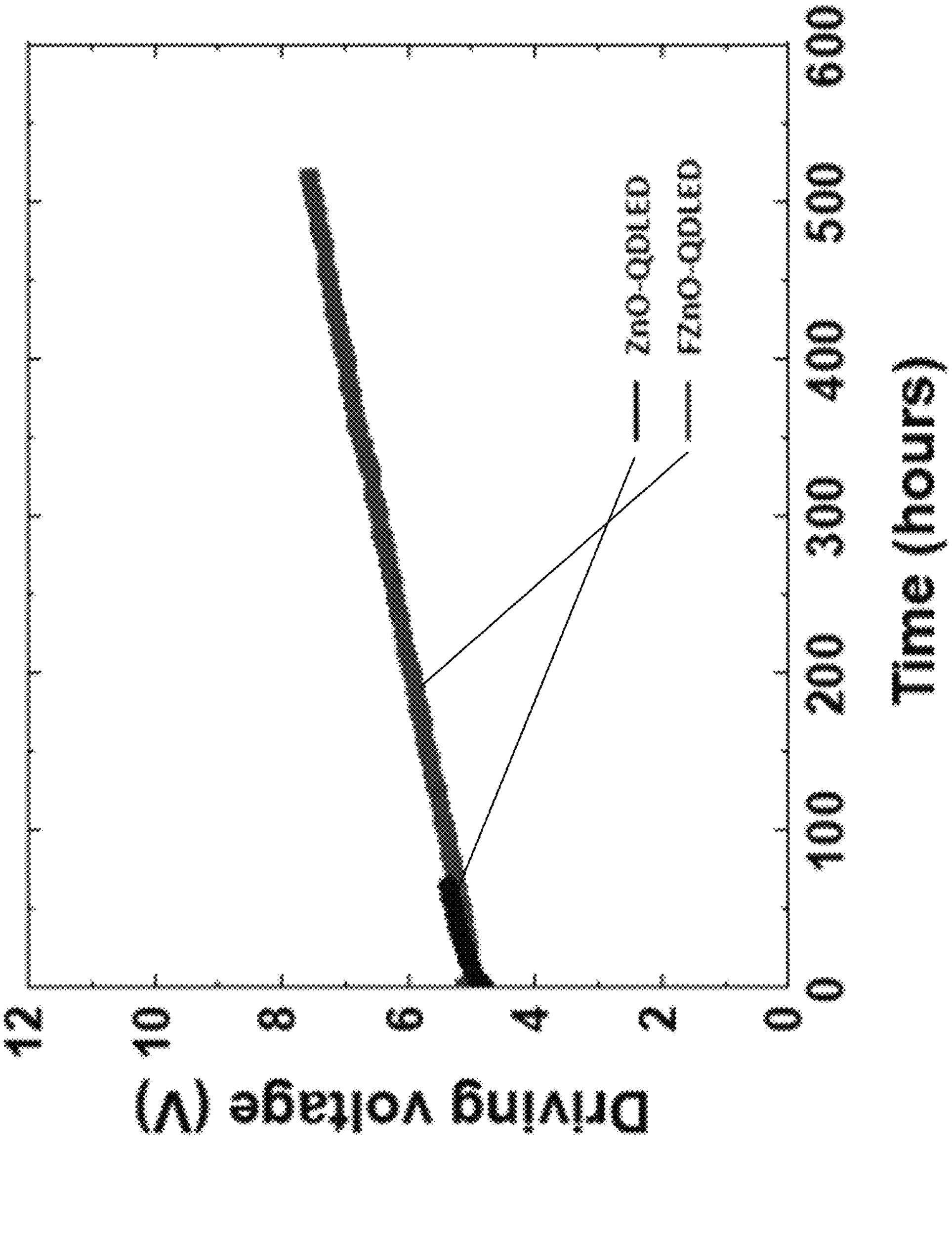
FIG. 15 is a graph of the driving voltage evolution during device operation. All the QDLEDs are operated at constant current 20 $mA/cm^2$.
Figure 16:
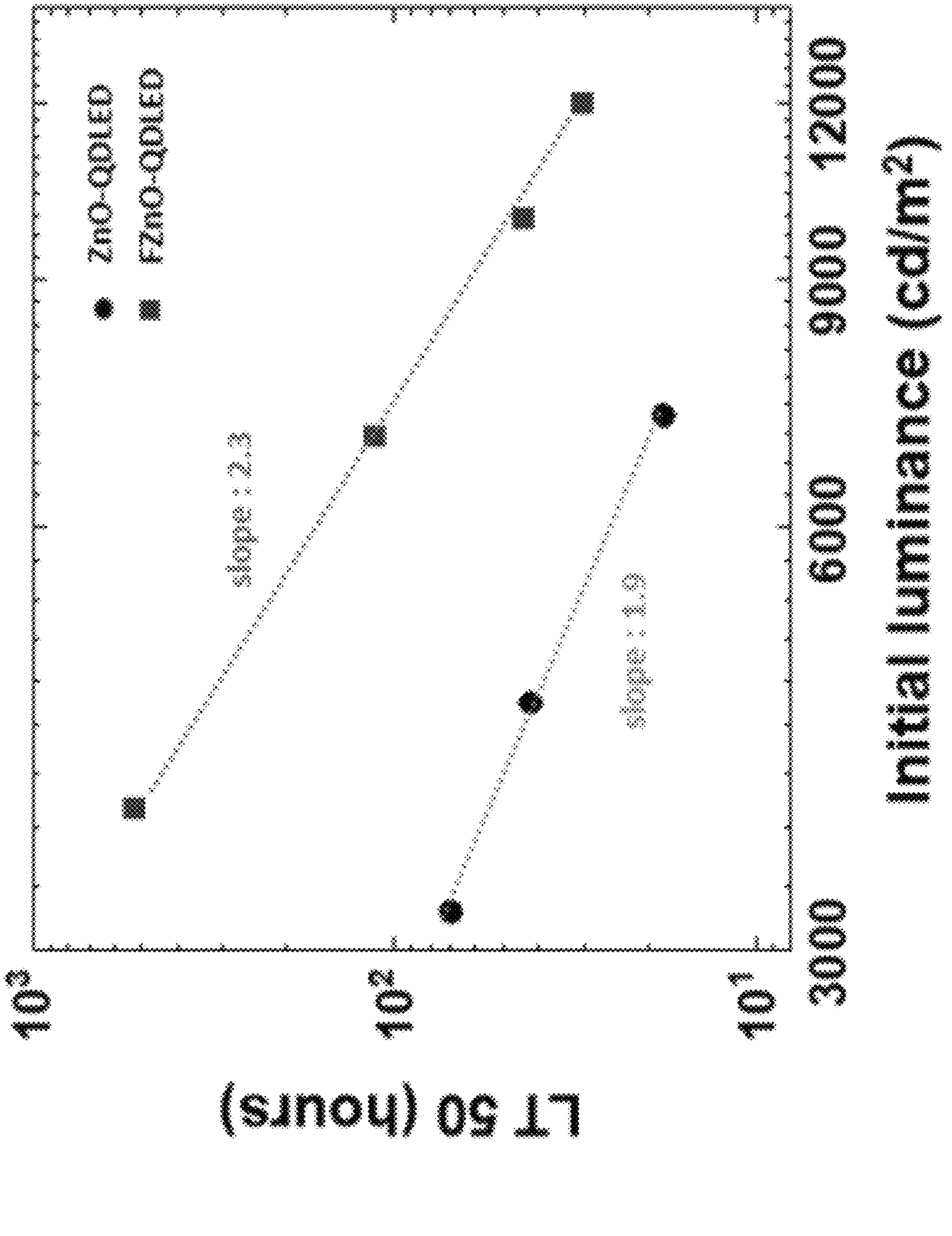
FIG. 16 is a graph of the acceleration factors extracted by LT50 measurement with different initial luminance values.

Significant improvement in device stability using FZnO is ETL has also been demonstrated. FIG. 14 shows luminance decay curves over time under constant current at 20 mA/$cm^2$ for the ZnO- and FZnO-QDLEDs. Since device efficiency is varied in each device, it should be kept in mind that luminance at the beginning of measurement ($L_0$) differs, 3,320 cd/$m^2$ and 3,910 cd/$m^2$ for ZnO- and FZnO-QDLED, respectively. FIGS. 14 and 15 show device operational output changes during measurement, i.e., the luminance percentage to the $L_0$ over time and driving voltage changes over time. The scaling coefficient n extracted by measurement of LT50 with different initial luminance is shown in FIG. 16. Interestingly, as can be clearly shown in FIG. 14, the LT50 (the time relative luminance reaches 50% of the $L_0$) improvement is observed in FZnO-QDLED. The LT50s of the control (ZnO) device and FZnO-QDLED are shown as 65 hours and 516 hours, respectively. Without consideration of individual $L_0$, LT50 is improved by 8 times by using FZnO as ETL. In addition, both QDLEDs show negligible difference in driving voltage evolution in FIG. 15. Unlike other reports, having exponential-like increase of driving voltage trend over time despite of slow luminance decay rate,[15-16] FZnO-QDLED shows linear-like increase of driving voltage that takes tremendous advantage on long-term device operation. Lifetime scaling coefficient n is extracted in FIG. 16 by multiple measurement of LT50 by different $L_0$ condition. Normalized LT50 for $L_0$ of 100 cd/$m^2$ is calculated for apparent comparison between devices by using the lifetime scaling equation $$^{42}L_0^n LT50 = \text{constant.}$$

with extracted scaling coefficients of 1.9 and 2.3 for QDLED with ZnO and FZnO, respectively. The normalized LT50s correspond to 50,475 hours for control device and 2,369,497 hours for FZnO-QDLED. The result reveals FZnO ETL considerably improves lifetime of QDLED 47 times longer than ZnO ETL in the same level of brightness as well as maintains long-term stability in driving voltage.

Methods

The inverted QDLEDs employed in these experiments are fabricated by multiple deposition of each functional layer. Indium tin oxide (ITO) patterned glass substrates (Kintec) are carefully cleaned and sonicated by Micro 90 cleaning solution (Cole-Parmer) and de-ionized water followed by sequential rinsing by acetone and isopropanol. The cleaned substrates are treated by oxygen plasma to improve the wettability on surface. 30 mg/mL of ZnO NP solution (SkySpring Nanomaterials, Inc.) is spin-coated at 3,000 rpm on the cleaned ITO substrates followed by 400° C. baking on a hotplate for 30 minutes. Low-kinetic energy plasma doping is performed in ICP-RIE chamber (Phantom RIE, Trion technology) filled with 20 sccm of $CF_4$ gas with 13.56 MHz operation frequency. 4 mg/mL CdZnSe/ZnSe/CdZnS/ZnS QD (Mesolight Inc.) dispersed in octane (Sigma-Aldrich) is deposited on ETL by spin-coating with 3000 rpm followed by post-baking on a 50° C. hotplate for 30 minutes. 50 nm of 4,4'-bis(N-carbazolyl)-1,1'-biphenyl (CBP, Angstrom Engineering), 5 nm of molybdenum trioxide ($MoO_3$, Angstrom Engineering) and 100 nm of aluminum (Al, Angstrom Engineering) are deposited by thermal evaporator (Angstrom Engineering) under $2\times10^{-7}$ Torr condition. Overall device structures are: ITO/ETL/QD/CBP (HTL)/$MoO_3$ (hole injection layer)/Al. All deposition processes are performed in nitrogen-filled glove box and vacuum chamber.

Device Characterization.

XPS measurement with depth profile are performed by VGS ESCALab 250 spectroscopy with Al Kalpha X-ray source. TOF-SIMS depth profile is measured by IonTOF-SIMS-5. J-V-L characteristics are measured by a Minolta CS-100 chromameter and an Agilent 4155C semiconductor parameter analyzer connected with a silicon photodiode. EL and PL spectra are measured by an Ocean Optics QE65000 spectrometer with an excitation source consisting of a Newport 67005 200W HgXe arc lamp and monochromator. Device luminance decay trajectories are recorded using a M6000PLUS OLED lifetime test system. Surface topography measurement are performed using a Veeco Nanoscope atomic force microscope (AFM). Time-resolved photoluminescence (TRPL) is measured by Edinburgh Instruments FL920 spectrometer. C-V characteristics are measured by Keithley 4200 semiconductor analyzer with a capacitance-voltage unit (4215-CVU). The QDLEDs are kept in a nitrogen atmosphere during measurement.

REFERENCES

1. Qian, L.; Zheng, Y.; Xue, J.; Holloway, P. H., Stable and efficient quantum-dot light-emitting diodes based on solution-processed multilayer structures. *Nature photonics* 2011, 5 (9), 543-548.
2. Kirkwood, N.; Singh, B.; Mulvaney, P., Enhancing quantum dot LED efficiency by tuning electron mobility in the ZnO electron transport layer. *Advanced Materials Interfaces* 2016, 3 (22), 1600868.
3. Kang, B.-H.; Kim, J.-S.; Lee, J.-S.; Lee, S.-W; Sai-Anand, G.; Jeong, H.-M.; Lee, S.-H.; Kwon, D.-H.; Kang, S.-W., Solution processable CdSe/ZnS quantum dots light-emitting diodes using ZnO nanocrystal as electron transport layer. *Journal of nanoscience and nanotechnology* 2015, 15 (9), 7416-7420.
4. Pan, J.; Chen, J.; Huang, Q.; Khan, Q.; Liu, X.; Tao, Z.; Zhang, Z.; Lei, W.; Nathan, A., Size tunable ZnO nanoparticles to enhance electron injection in solution processed QLEDs. *ACS photonics* 2016, 3 (2), 215-222.
5. Mashford, B. S.; Stevenson, M.; Popovic, Z.; Hamilton, C.; Zhou, Z.; Breen, C.; Steckel, J.; Bulovic, V.; Bawendi, M.; Coe-Sullivan, S., High-efficiency quantum-dot light-emitting devices with enhanced charge injection. *Nature photonics* 2013, 7 (5), 407-412.
6. Song, J.; Wang, O.; Shen, H.; Lin, Q.; Li, Z.; Wang, L.; Zhang, X.; Li, L. S., Over 30% external quantum efficiency light-emitting diodes by engineering quantum dot-assisted energy level match for hole transport layer. *Advanced Functional Materials* 2019, 29 (33), 1808377.
7. Liu, L.; Mei, Z.; Tang, A.; Azarov, A.; Kuznetsov, A.; Xue, Q.-K.; Du, X., Oxygen vacancies: The origin of n-type conductivity in ZnO. *Physical Review B* 2016, 93 (23), 235305.
8. Chen, D.; Jiao, X.; Cheng, G., Hydrothermal synthesis of zinc oxide powders with different morphologies. *Solid State Communications* 1999, 113 (6), 363-366.
9. Znaidi, L., Sol-gel-deposited ZnO thin films: A review. *Materials Science and Engineering: B* 2010, 174 (1-3), 18-30.
10. Fan, H. J.; Scholz, R.; Kolb, F. M.; Zacharias, M.; Gösele, U., Growth mechanism and characterization of zinc oxide microcages. *Solid State Communications* 2004, 130 (8), 517-521.
11. Ishii, H.; Sugiyama, K.; Ito, E.; Seki, K., Energy level alignment and interfacial electronic structures at organic/metal and organic/organic interfaces. *Advanced materials* 1999, 11 (8), 605-625.
12. Casteleiro, C.; Gomes, H. L.; Stallinga, P.; Bentes, L.; Ayouchi, R.; Schwarz, R., Study of trap states in zinc oxide (ZnO) thin films for electronic applications. *Journal of non-crystalline solids* 2008, 354 (19-25), 2519-2522.
13. Chen, S.; Cao, W.; Liu, T.; Tsang, S.-W.; Yang, Y.; Yan, X.; Qian, L., On the degradation mechanisms of quantum-dot light-emitting diodes. *Nature communications* 2019, 10 (1), 1-9.
14. Lin, B.-Y.; Ding, W.-C.; Chen, C.-H.; Kuo, Y.-P.; Lee, J.-H.; Lee, C.-Y.; Chiu, T.-L., Lifetime elongation of quantum-dot light-emitting diodes by inhibiting the degradation of hole transport layer. *RSC Advances* 2021, 11 (34), 20884-20891.
15. Chung, D. S.; Davidson-Hall, T.; Yu, H.; Samaeifar, F.; Chun, P.; Lyu, Q.; Cotella, G.; Aziz, H., Significant enhancement in quantum-dot light emitting device stability via a ZnO:polyethylenimine mixture in the electron transport layer. *Nanoscale Advances* 2021, 3 (20), 5900-5907.
16. Davidson-Hall, T.; Aziz, H., Significant enhancement in quantum dot light-emitting device stability via a cascading hole transport layer. *ACS applied materials & interfaces* 2020, 12 (14), 16782-16791.
17. Dai, X.; Zhang, Z.; Jin, Y.; Niu, Y.; Cao, H.; Liang, X.; Chen, L.; Wang, J.; Peng, X., Solution-processed, high-performance light-emitting diodes based on quantum dots. *Nature* 2014, 515 (7525), 96-99.
18. Ding, K.; Chen, H.; Fan, L.; Wang, B.; Huang, Z.; Zhuang, S.; Hu, B.; Wang, L., Polyethylenimine insulativity-dominant charge-injection balance for highly efficient inverted quantum dot light-emitting diodes. *ACS applied materials & interfaces* 2017, 9 (23), 20231-20238.
19. Lin, Q.; Wang, L.; Li, Z.; Shen, H.; Guo, L.; Kuang, Y.; Wang, H.; Li, L. S., Nonblinking quantum-dot-based blue light-emitting diodes with high efficiency and a balanced charge-injection process. *ACS Photonics* 2018, 5 (3), 939-946.
20. Davidson-Hall, T.; Aziz, H., The role of polyethylenimine in enhancing the efficiency of quantum dot light-emitting devices. *Nanoscale* 2018, 10 (5), 2623-2631.
21. Shi, Y-L.; Liang, F.; Hu, Y.; Zhuo, M.-P.; Wang, X.-D.; Liao, L.-S., High performance blue quantum dot light-emitting diodes employing polyethylenimine ethoxylated as the interfacial modifier. *Nanoscale* 2017, 9 (39), 14792-14797.
22. Zhang, Z.; Ye, Y.; Pu, C.; Deng, Y.; Dai, X.; Chen, X.; Chen, D.; Zheng, X.; Gao, Y.; Fang, W., High-performance, solution-processed, and insulating-layer-free light-emitting diodes based on colloidal quantum dots. *Advanced Materials* 2018, 30 (28), 1801387.
23. Won, Y.-H.; Cho, O.; Kim, T.; Chung, D.-Y.; Kim, T.; Chung, H.; Jang, H.; Lee, J.; Kim, D.; Jang, E., Highly efficient and stable InP/ZnSe/ZnS quantum dot light-emitting diodes. *Nature* 2019, 575 (7784), 634-638.
24. Alexandrov, A.; Zvaigzne, M.; Lypenko, D.; Nabiev, I.; Samokhvalov, P., Al-, Ga-, Mg-, or Li-doped zinc oxide nanoparticles as electron transport layers for quantum dot light-emitting diodes. *Scientific reports* 2020, 10 (1), 1-11.
25. Zhang, Q.; Gu, X.; Zhang, Q.; Jiang, J.; Jin, X.; Li, F.; Chen, Z.; Zhao, F.; Li, Q., ZnMgO:ZnO composite films for fast electron transport and high charge balance in quantum dot light emitting diodes. *Optical Materials Express* 2018, 8 (4), 909-918.
26. Ding, S.; Wu, Z.; Qu, X.; Tang, H.; Wang, K.; Xu, B.; Sun, X. W., Impact of the resistive switching effects in ZnMgO electron transport layer on the aging characteristics of quantum dot light-emitting diodes. *Applied Physics Letters* 2020, 117 (9), 093501.
27. Lee, C. Y.; Naik Mude, N.; Lampande, R.; Eun, K. J.; Yeom, J. E.; Choi, H. S.; Sohn, S. H.; Yoo, J. M.; Kwon, J. H., Efficient cadmium-free inverted red quantum dot light-emitting diodes. *ACS applied materials & interfaces* 2019, 11 (40), 36917-36924.
28. Choi, Y-J.; Park, H.-H., A simple approach to the fabrication of fluorine-doped zinc oxide thin films by atomic layer deposition at low temperatures and an investigation into the growth mode. *Journal of Materials Chemistry C* 2014, 2 (1), 98-108.
29. Han, W.; Oh, S.; Lee, C.; Kim, J.; Park, H.-H., ZnO Nanocrystal Thin Films for Quantum-Dot Light-Emitting Devices. *ACS Applied Nano Materials* 2020, 3 (8), 7535-7542.
30. Choi, Y.-J.; Kang, K.-M.; Park, H.-H., Anion-controlled passivation effect of the atomic layer deposited ZnO films by F substitution to O-related defects on the electronic band structure for transparent contact layer of solar cell applications. *Solar Energy Materials and Solar Cells* 2015, 132, 403-409.
31. Polydorou, E.; Zeniou, A.; Tsikritzis, D.; Soultati, A.; Sakellis, I.; Gardelis, S.; Papadopoulos, T. A.; Briscoe, J.; Palilis, L. C.; Kennou, S., Surface passivation effect by fluorine plasma treatment on ZnO for efficiency and lifetime improvement of inverted polymer solar cells. *Journal of Materials Chemistry A* 2016, 4 (30), 11844-11858.
32. Ye, Z.; Wong, M., Characteristics of plasma-fluorinated zinc oxide thin-film transistors. *IEEE electron device letters* 2012, 33 (8), 1147-1149.
33. Seo, J.-S.; Jeon, J.-H.; Hwang, Y. H.; Park, H.; Ryu, M.; Park, S.-H. K.; Bae, B.-S., Solution-processed flexible fluorine-doped indium zinc oxide thin-film transistors fabricated on plastic film at low temperature. *Scientific reports* 2013, 3 (1), 1-9.
34. Pandey, R.; Wie, C. H.; Lin, X.; Lim, J. W; Kim, K. K.; Hwang, D. K.; Choi, W. K., Fluorine doped zinc tin oxide multilayer transparent conducting Oxides for organic photovoltaic's Cells. *Solar Energy Materials and Solar Cells* 2015, 134, 5-14.
35. Ammaih, Y.; Hartiti, B.; Ridah, A.; Lfakir, A.; Soucase, B. M.; Thevenin, P. In *Effect of F-doping on structural, electrical, and optical properties of ZnO thin films for optoelectronic application,* 2016 International Renewable and Sustainable Energy Conference (IRSEC), IEEE: 2016; pp 208-211.
36. Lieberman, M. A.; Lichtenberg, A. J., *Principles of plasma discharges and materials processing*. John Wiley & Sons: 2005.
37. Xu, Y.; Bo, B.; Gao, X.; Qiao, Z., Passivation effect on ZnO films by SF6 plasma treatment. *Crystals* 2019, 9 (5), 236.
38. Rodnyi, P.; Khodyuk, I., Optical and luminescence properties of zinc oxide. *Optics and Spectroscopy* 2011, 111 (5), 776-785.
39. Simpson, J.; Cordaro, J. F., Characterization of deep levels in zinc oxide. *Journal of Applied Physics* 1988, 63 (5), 1781-1783.
40. Würfel, U.; Neher, D.; Spies, A.; Albrecht, S., Impact of charge transport on current-voltage characteristics and power-conversion efficiency of organic solar cells. *Nature communications* 2015, 6 (1), 1-9.
41. Anderson, B.; Anderson, R., *Fundamentals of semiconductor devices*. McGraw-Hill, Inc.: 2004.
42. Davidson-Hall, T.; Aziz, H., Perspective: Toward highly stable electroluminescent quantum dot light-emitting devices in the visible range. *Applied Physics Letters* 2020, 116 (1), 010502.

The invention claimed is:

1. A process for preparing a halogen-doped metal oxide material comprising the step of exposing a metal oxide layer to a halogen source, wherein the halogen source is selected from a halogen-containing plasma, a halogenated solvent and a halogen gas, and wherein the metal oxide layer is an electron transport layer (ETL) deposited during manufacture of a light emitting device (LED).

2. The process of claim 1, wherein the halogen is selected from fluorine (F), bromine (Br), iodine (I), chlorine (CI), or a combination thereof.

3. The process of claim 2, wherein the halogen is F.

4. The process of claim 1, wherein the halogen source is a fluorine-containing plasma.

5. The process of claim 4, wherein the fluorine-containing plasma is generated using $CF_4$, $CHF_3$, $C_4F_8$ or $SF_6$.

6. The process of claim 1, wherein the metal oxide layer comprises a metal oxide selected from ZnO, TiOx, SnOx, MgO, indium tin oxide (ITO), or a combination thereof.

7. The process of claim 6, wherein the metal oxide is ZnO.

8. The process of claim 7, wherein the metal oxide is nanoparticle ZnO.

9. The process of claim 1, wherein the LED is a quantum-dot light emitting device (QDLED).

10. The process of claim 1, wherein the step of exposing the metal oxide layer to a halogen-containing plasma is carried out as a low kinetic energy plasma treatment step, wherein the low kinetic plasma treatment step is carried out using a mid-chamber plasma configuration, a downstream plasma treatment, or an ICP (inductively-coupled plasma) reactor.

11. A method comprising converting a metal oxide layer to a halogen-doped metal oxide through exposure to a halogen source, wherein the halogen source is selected from a halogen-containing plasma, a halogenated solvent and a halogen gas, and wherein the halogen-doped metal oxide forms an electron transport layer (ETL) of a light emitting device (LED).

12. The method of claim 11, wherein the halogen source is a halogen-containing plasma.

13. The method of claim 12, wherein the halogen is F.

14. The method of claim 13, wherein the metal oxide is ZnO.

15. The method of claim 14, wherein the LED is a quantum-dot light emitting device (QDLED).

* * * * *